United States Patent
Kerr et al.

(10) Patent No.: US 7,051,429 B2
(45) Date of Patent: May 30, 2006

(54) METHOD FOR FORMING A MEDIUM HAVING DATA STORAGE AND COMMUNICATION CAPABILITIES

(75) Inventors: Roger S. Kerr, Brockport, NY (US); Timothy J. Tredwell, Fairport, NY (US); Cheryl J. Kaminsky, Rochester, NY (US); Robert P. Bourdelais, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 293 days.

(21) Appl. No.: 10/411,624

(22) Filed: Apr. 11, 2003

(65) Prior Publication Data
US 2004/0203185 A1    Oct. 14, 2004

(51) Int. Cl.
*H01R 43/00*  (2006.01)

(52) U.S. Cl. .............................. 29/825; 29/600; 29/601; 29/602.1; 29/603.25; 29/604; 29/832; 29/848; 264/284; 340/572.7

(58) Field of Classification Search ................. 29/600, 29/601, 602.1, 603.23, 603.25, 606, 840, 29/825, 832, 841, 846, 848; 264/1.7, 2.7, 264/157, 284, 293; 235/492; 340/572.1, 340/572.7; 361/760–762
See application file for complete search history.

(56) References Cited

U.S. PATENT DOCUMENTS

| | | | |
|---|---|---|---|
| 4,275,103 A | 6/1981 | Tsubusaki et al. | |
| 4,394,441 A | 7/1983 | Kawaguchi et al. | |
| 4,416,963 A | 11/1983 | Takimoto et al. | |
| 4,418,141 A | 11/1983 | Kawaguchi et al. | |
| 4,431,764 A | 2/1984 | Yoshizumi | |
| 4,495,276 A | 1/1985 | Takimoto et al. | |
| 4,571,361 A | 2/1986 | Kawaguchi et al. | |
| 4,604,678 A * | 8/1986 | Hagner ........................ | 361/761 |
| 4,999,276 A | 3/1991 | Kuwabaa et al. | |
| 5,122,445 A | 6/1992 | Ishigaki | |
| 5,267,228 A * | 11/1993 | Yashima et al. ............. | 264/106 |
| 5,294,525 A | 3/1994 | Yamauchi et al. | |
| 5,300,575 A | 4/1994 | Jonas et al. | |
| 5,312,681 A | 5/1994 | Muys et al. | |
| 5,340,676 A | 8/1994 | Anderson et al. | |
| 5,354,613 A | 10/1994 | Quintens et al. | |
| 5,368,995 A | 11/1994 | Christian et al. | |
| 5,370,981 A | 12/1994 | Krafft et al. | |
| 5,372,924 A | 12/1994 | Quintens et al. | |
| 5,382,494 A | 1/1995 | Kudo et al. | |
| 5,391,472 A | 2/1995 | Muys et al. | |
| 5,403,467 A | 4/1995 | Jones et al. | |
| 5,443,944 A | 8/1995 | Krafft et al. | |
| 5,459,021 A | 10/1995 | Ito et al. | |
| 5,466,576 A | 11/1995 | Schulz et al. | |
| 5,484,694 A | 1/1996 | Lelental et al. | |
| 5,528,222 A | 6/1996 | Moskowitz et al. | |
| 5,566,441 A * | 10/1996 | Marsh et al. .................. | 29/600 |
| 5,575,898 A | 11/1996 | Wolf et al. | |

(Continued)

FOREIGN PATENT DOCUMENTS

EP    0 841 634 A    5/1998

(Continued)

*Primary Examiner*—Minh Trinh
*Assistant Examiner*—Donghai D. Nguyen
(74) *Attorney, Agent, or Firm*—Roland R. Schindler, II

(57) ABSTRACT

A method for forming a medium having a substrate is formed have a patterned surface with a channel pattern and a transponder having a memory is provided in the channel pattern. A conductive material is deposited in the channel pattern with the conductive material operatively associated with the transponder.

44 Claims, 13 Drawing Sheets

U.S. PATENT DOCUMENTS

| | | |
|---|---|---|
| 5,700,623 A | 12/1997 | Anderson et al. |
| 5,757,021 A | 5/1998 | Dewaele |
| 5,962,840 A | 10/1999 | Haghiri et al. |
| 6,096,491 A | 8/2000 | Majumdar et al. |
| 6,124,083 A | 9/2000 | Majumdar et al. |
| 6,248,199 B1 | 6/2001 | Smulson |
| 6,329,213 B1 | 12/2001 | Tuttle et al. |
| 6,568,600 B1 * | 5/2003 | Carpier et al. ............. 235/492 |
| 2002/0101619 A1 | 8/2002 | Tsubaki et al. |

FOREIGN PATENT DOCUMENTS

| | | |
|---|---|---|
| JP | 02-164872 | 6/1990 |
| JP | 06044265 | 7/1992 |
| WO | WO 01/26180 | 4/2001 |
| WO | WO 01/37622 | 5/2001 |

* cited by examiner

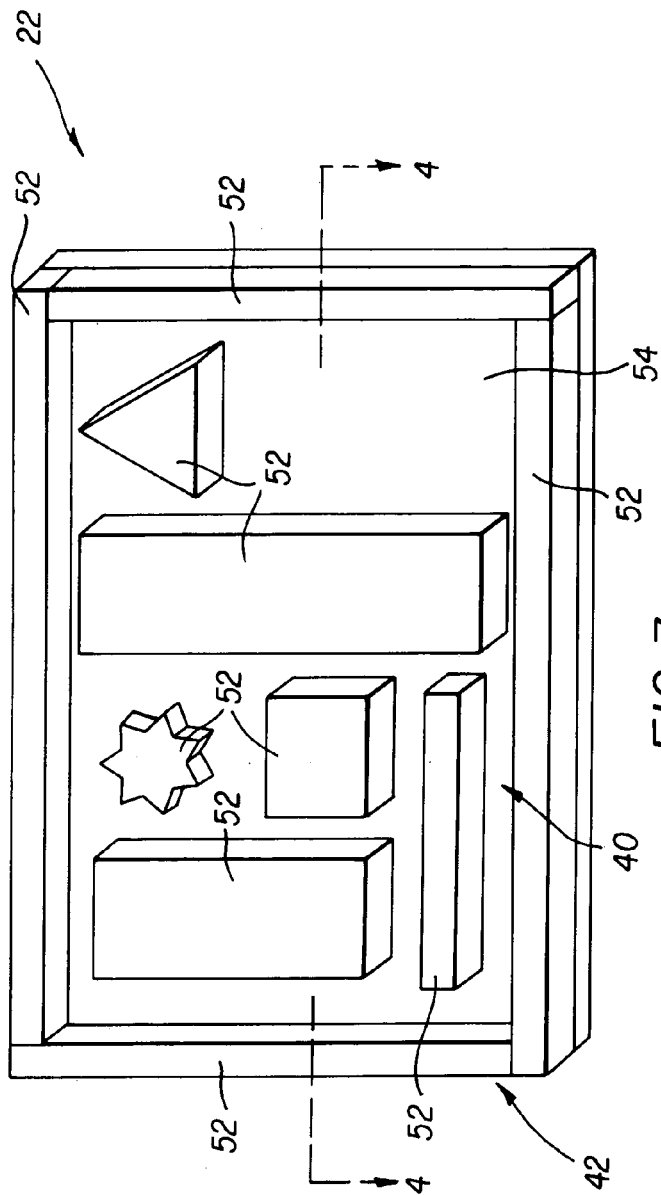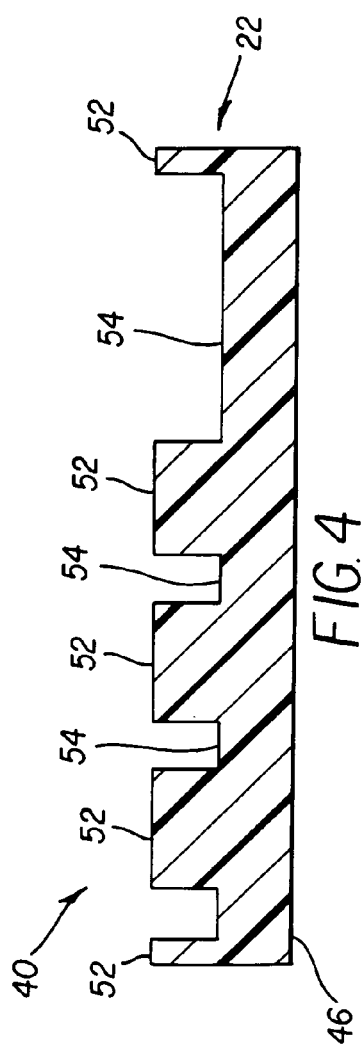
FIG. 3
FIG. 4

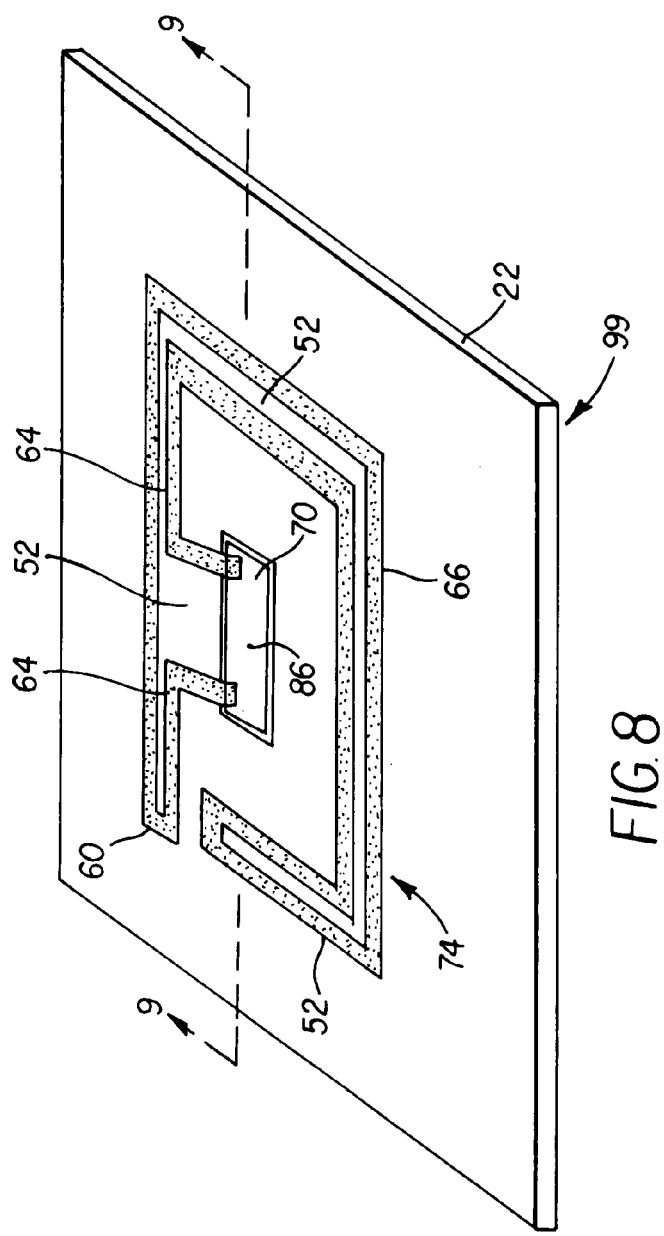
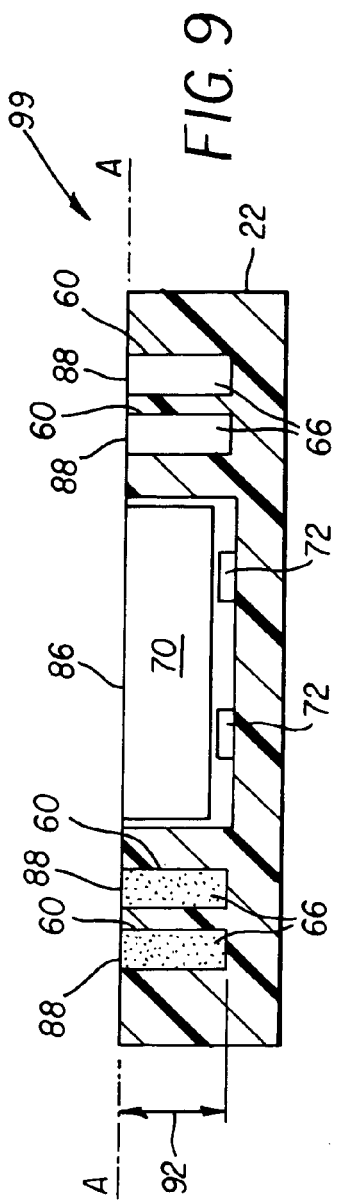

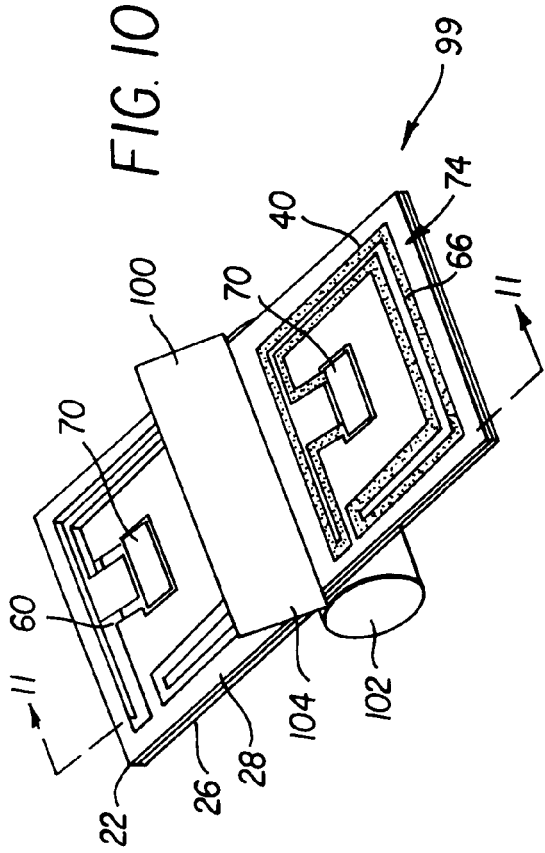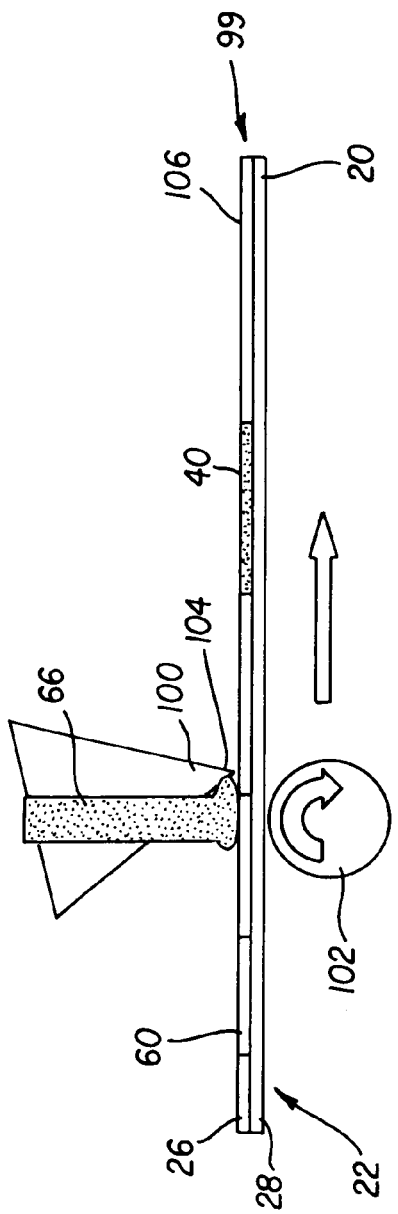

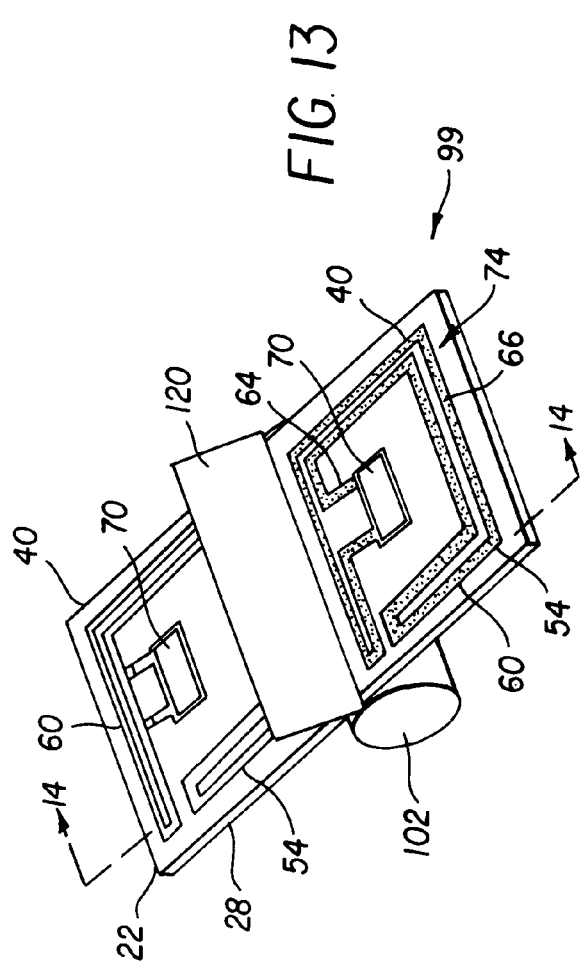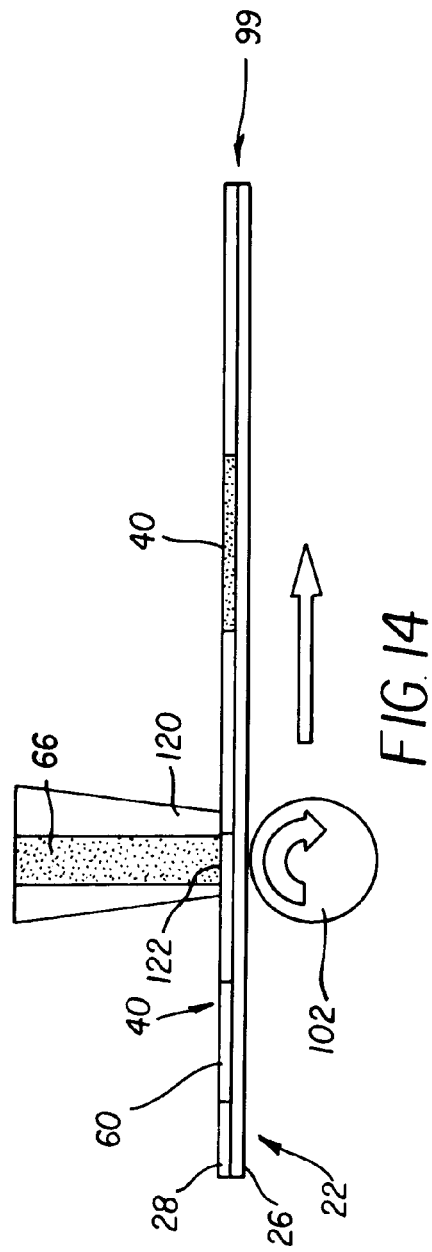

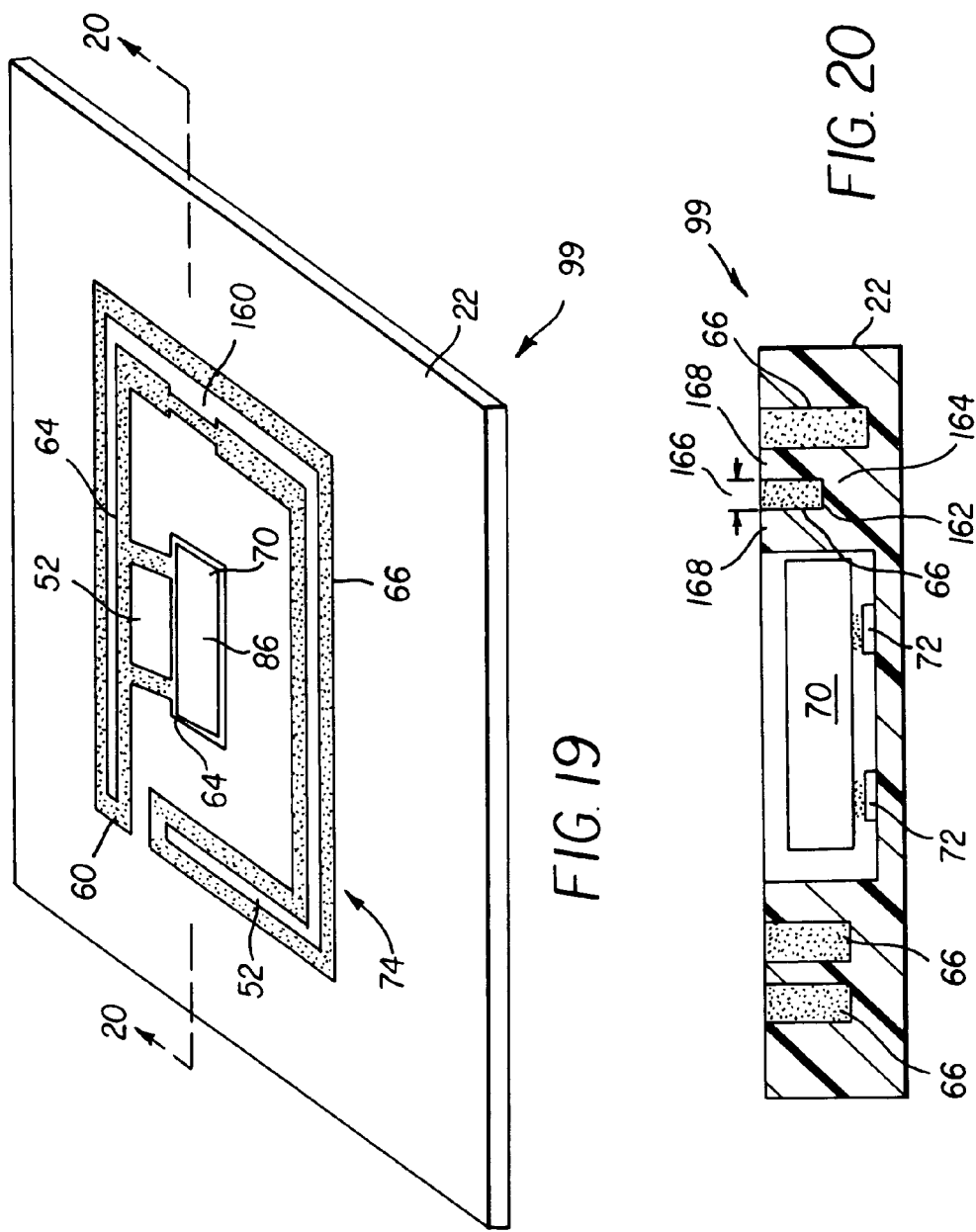

METHOD FOR FORMING A MEDIUM HAVING DATA STORAGE AND COMMUNICATION CAPABILITIES

CROSS REFERENCE TO RELATED APPLICATIONS

Reference is made to commonly assigned co-pending U.S. patent application Ser. No. 10/256,824 filed herewith, entitled Medium Having Data Storage and Communication Capabilities and Method For Forming Same, by Kerr et al. filed on Dec. 27, 2002; U.S. patent application Ser. No. 10/256,769, entitled Medium Having Data Storage and Communication Capabilities and Method For Forming Same, by Kerr et al. filed on Dec. 27, 2002; and U.S. patent application Ser. No. 10/161,514, entitled Virtual Annotation Of A Recording On An Archival Media by Kerr et al. filed on Jun. 3, 2002.

FIELD OF THE INVENTION

The present invention relates in general to the field of mediums and more particularly to mediums having electronic memory associated therewith.

BACKGROUND OF THE INVENTION

Thin mediums of material such as paper, film and fabric have many useful applications. Often images and information are recorded on such mediums. Where information regarding characteristics of a medium is known before an image is recorded on the medium, the recording process can be adjusted to improve the quality of the recording. Once a recording has been made on a medium it can be useful to associate information in a memory that is associated with the medium. Such information can include information that describes the chain of custody of the medium, the use of the medium, and who has accessed the medium. Other useful information can also be associated with the medium such as information that depicts information recorded on the medium. See for example, commonly assigned U.S. patent application Ser. No. 10/161,514, entitled Virtual Annotation of a Recording on an Archival Media, filed by Kerr et al. on Jun. 3, 2002.

It is known to use Radio Frequency Identification (RFID) tags to provide an electronic memory and communication capabilities that allow information to be associated with a medium electronically. Such RFID tags typically comprise three principal elements, an antenna and transponder that cooperate to send and receive electromagnetic fields containing information, and a memory that stores information received by the transponder and provides stored information for use by the transponder.

The RFID tag is adapted to exchange information with a co-designed reading/writing device. Information that is stored in an RFID tag that is joined to an item can later be used to track, identify and process the item. The RFID tag can also store other information that is to be associated with the item. A commercially available "TAG-IT INLAY"™ RFID tag available from Texas Instruments, Incorporated, Dallas, Tex., USA, can be used to provide identifying information about an item to which the RFID tag is attached. This relatively thin, flexible type of RFID tag can be used in applications that previously required a label or bar code. The RFID tags of the prior art are typically used for identification purposes, such as for employee badges, inventory control, and credit card account identification. The advantage of such RFID tags is that they are small in size, easy to communicate with and, unlike a bar coded item, do not require the item to be optically aligned to the reader or scanner.

RFID tags have been proposed for use in applications with passports and credit cards, such as is disclosed in U.S. Pat. No. 5,528,222 entitled Radio Frequency Circuit and Memory in Thin Flexible Package filed by Moskowitz et al. on Sep. 9, 1994. These devices are useful for tracking the location, characteristics and usage of documents, books and packages. For example, such tags can be used to track the location of documents and track the chain of custody of such documents within a document management system.

RFID tags are typically formed into a package such as an inlay, or a plastic, glass or ceramic housing. The RFID package is then joined to an item such as a document or book after the item has been fully assembled. The RFID tag often has an adhesive surface that is used to form a bond between the RFID tag and the item to which it is being joined. It is also known to use other ways of mechanically joining an RFID tag to an item. For example, an RFID tag can be joined to an item using a staple or other mechanical fastener.

There is room for improvement in this arrangement. For example, a poor bond or poor mechanical joint between the RFID tag and the item can result in separation of the RFID tag from the item. This can defeat the purpose of joining the RFID tag to the item. Further, joining an RFID tag to an item increases the cost of the combined RFID tag and item because the RFID tag must include the cost of both the base and the fastener and the cost of labor associated with joining the RFID tag to the item. These costs can become significant where RFID tags are to be joined to a multiplicity of individual items, such as for example, individual sheets of a medium such as film or paper.

Additionally, such RFID tags typically take the form of a patterned antenna located on a base having a transponder unit applied to the top of the antenna. Accordingly, such RFID tags have a non-uniform cross-sectional area. The non-uniform cross-section of the tag can make the tag vulnerable to incidental damage to contact during manufacturing, printing, use, storage and distribution. Further, such RFID tags can interfere with the appearance and use of the item.

One approach for solving these problems is to incorporate RFID tags inside an item such as an identification badge. In one example, a clamshell type of outer casing in which the RFID electronics and antenna are deposited is provided. An example of such an identification badge is the ProxCard II proximity access card sold by HID Corporation, Irvine, Calif., USA. Thinner cards are made by sandwiching the RFID electronics and antenna between sheets of laminate material. An example of such a badge is the ISO ThinCard also sold by HID Corporation. While this method of forming a card produces a card that is thinner than the clamshell type card, the card has an uneven cross-section with increased thickness in the area of the RFID electronics.

These techniques, however, are not feasibly applied to the task of forming a thin medium such as paper, film and fabric. Such thin mediums are typically fabricated in high volumes using coating, extrusion and rolling techniques to convert pulp, gelatin or other material into thin sheets of material that are then processed into useful forms. The addition of a clamshell type structure known in the art is not practical or economically feasible in this type of production. The alternative lamination approach of the prior art is also not preferred because the increased thickness and uneven cross section caused by the presence of RFID electronics and antenna sandwiched between laminations can interfere with subsequent fabrication processes causing damage to fabrication equipment, the RFID electronics, the antenna or to the medium itself. Further, this uneven cross section can interfere with imaging equipment when a laminated medium having the RFID electronics and antenna is passed through equipment such as a printer that uses a medium after formation. This interference can damage the RFID tag, the medium and the equipment that uses the medium. The uneven cross section also can create a less than desirable appearance for the medium and images that are subsequently recorded thereon. Also, the antenna required to allow communication with the RFID electronics can cause the medium to be considerably larger and higher in cost if the medium is required to be transparent such as would be required for mediums such as an x-ray, an overhead or a lenticular or other display.

Alternatively, RFID circuits or circuit components can be formed by printing conductive materials such as inks onto a surface of a medium. For example Parmond® VLTRFID circuit sold by Paralec Inc., Princetone, N.J., USA are made in the way other circuits can be made using conductor inks such as those sold by Flint Ink in Ann Arbor, Mich., USA. However, it can be difficult to use such printing techniques to form high density patterns of conductors on a medium particularly at high volume media production rates.

Thus, a need exists for a medium that has the ability to store and electronically exchange data. A need also exists for a medium with this ability that is also compatible with conventional web fabrication processes, or post fabrication uses of the medium. Further, a need exists for a medium that can provide an antenna or RFID electronics using essentially transparent structures if required.

SUMMARY OF THE INVENTION

In one aspect of the invention, a method is provided for forming a medium. In accordance with the method a substrate is formed having a patterned surface with a channel pattern and a transponder having a memory is provided in the channel pattern. A conductive material is deposited in the channel pattern with the conductive material operatively associated with the transponder.

In another aspect of the invention, a method is provided for forming a medium. In accordance with the method, a substrate web is formed with a patterned surface having a channel pattern. A transponder having a memory is provided in the channel pattern. A conductive material is coated into the channel pattern with the conductive material electrically contacting the transponder, wherein the channel pattern includes an antenna pattern and wherein conductive material coated into the antenna pattern forms an antenna operatively associated with the transponder.

In still another aspect of the invention, a medium is provided. The medium has a substrate having a patterned surface with a channel pattern and a transponder having a memory positioned in a portion of the channel pattern. A conductive material is in another portion of the channel pattern, wherein the transponder and conductive material are operatively associated.

In a further aspect of the invention, a medium is provided. The medium has a substrate having a channel pattern the channel pattern having a transponder channel adapted to receive a transponder and an antenna portion. A transponder having a memory is positioned in the transponder channel. A conductive material is deposited in the channel pattern and operatively associated with the transponder.

BRIEF DESCRIPTION OF THE DRAWINGS

A more complete understanding of the invention and its advantages will become apparent from the detailed description taken in conjunction with the accompanying drawings, wherein examples of the invention are shown, and identical reference numbers have been used, where possible, to designate identical elements that are common to the figures referenced below:

FIG. 3 shows an example of a substrate;

FIG. 4 shows a cross section view of the example substrate of FIG. 3;

FIG. 8 shows a perspective view of a medium formed in accordance with the invention;

FIG. 9 shows a cross section view of the embodiment shown in FIG. 8;

FIG. 10 shows one example of a coating method;

FIG. 11 shows a cross-section view of the example of the coating method of FIG. 10;

FIG. 13 is a perspective view of yet another example of a coating method;

FIG. 14 shows a cross section view of the coating method shown in FIG. 13;

FIG. 19 shows yet another embodiment of a medium in accordance with the present invention;

FIG. 20 shows a cross section view of the embodiment of the medium shown in FIG. 19.

DETAILED DESCRIPTION OF THE INVENTION

The present invention will be directed in particular to elements forming part of, or in cooperation more directly with the methods and mediums of the present invention. It is to be understood that elements not specifically shown or described may take various forms well known to those skilled in the art.

Substrate Formation

Figure 1:
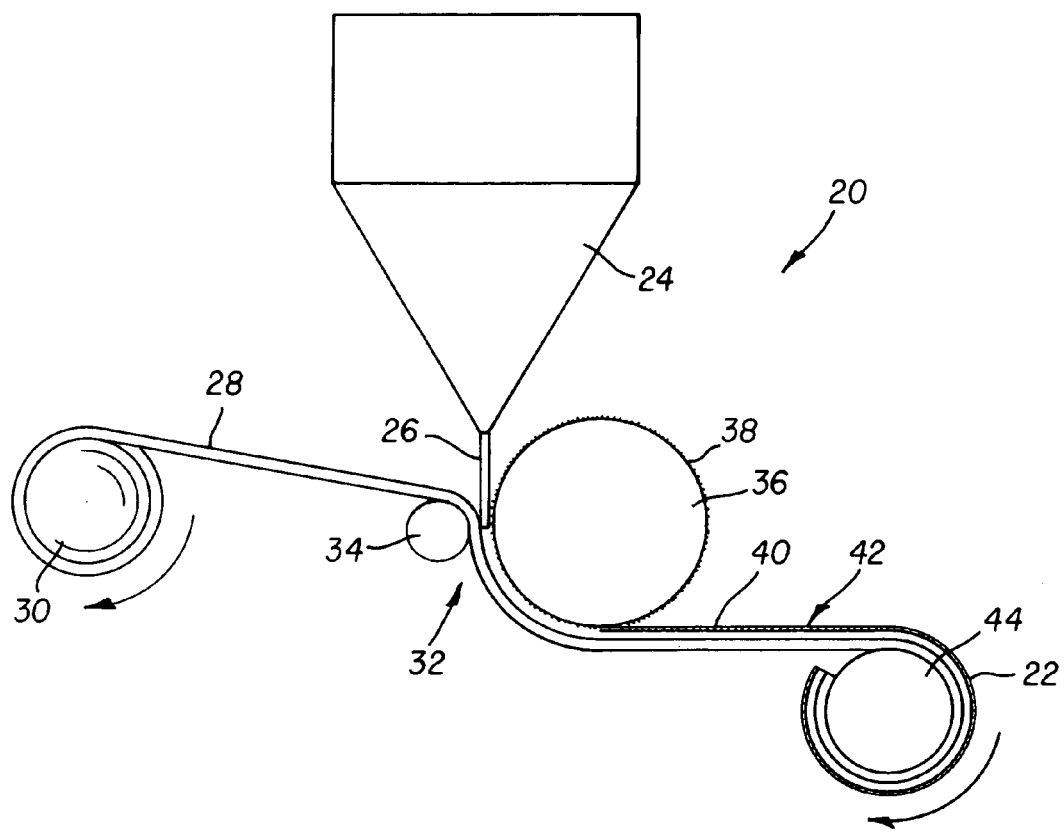
FIG. 1 shows a first embodiment of an extrusion roll molding apparatus.
Figure 2:
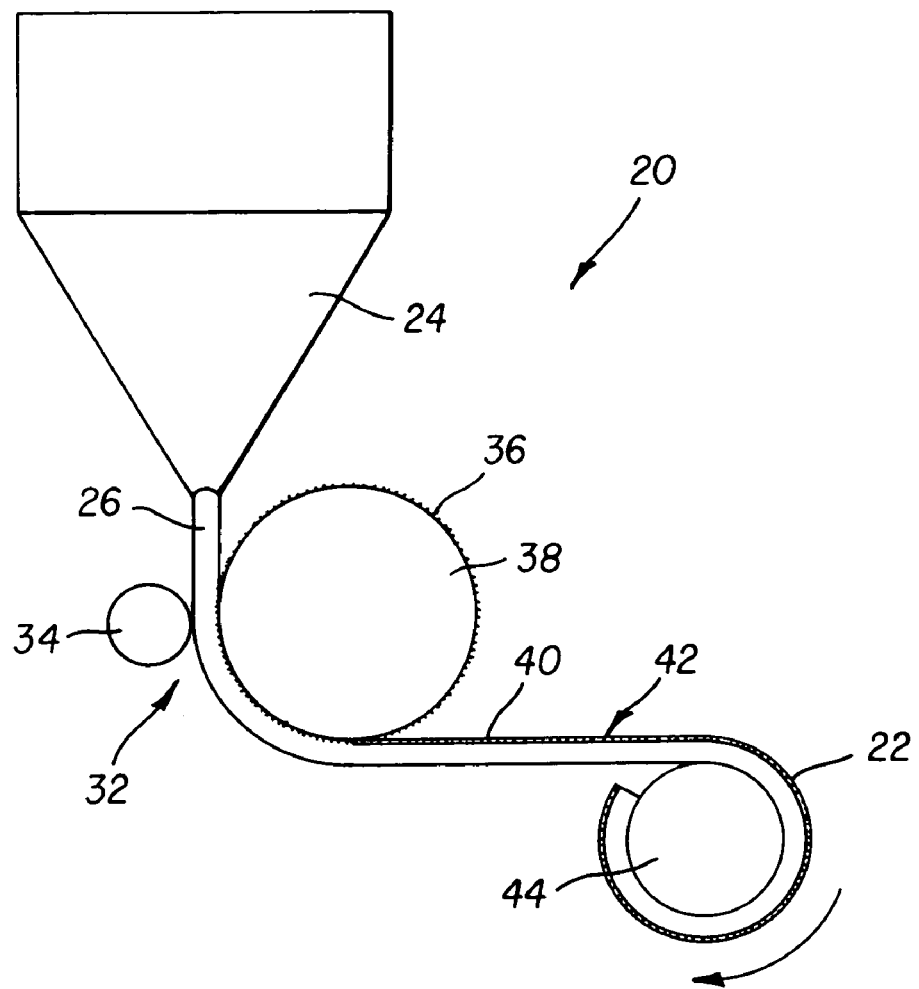
FIG. 2 shows another embodiment of an extrusion roll molding apparatus.

The medium of the present invention is formed using a substrate having a pattern of raised areas and channels. FIGS. 1 and 2 show alternative embodiments for the formation of such a substrate.

FIG. 1 shows a schematic illustration of an overall arrangement of one embodiment of an extrusion roll molding apparatus 20 for fabricating a substrate 22. In this embodiment, an extruder 24 provides a thermoplastic material 26, such as a polymer, onto a base 28 that can be formed from the same material as thermoplastic material 26 or that can be formed from different materials such as papers, films, fabrics or other useful base materials. Base 28 is fed from a base supply roll 30. Thermoplastic material 26 and base 28 pass into a nip area 32 between a pressure roller 34 and a pattern roller 36. As thermoplastic material 26 passes through nip area 32, pressure roller 34 and pattern roller 36 press the thermoplastic material 26 onto base 28 and a roller pattern 38 of raised surfaces and channels (not shown) on pattern roller 36 is impressed into thermoplastic material 26. When roller pattern 38 is impressed into thermoplastic material 26 some of the melted thermoplastic material 26 fills channels (not shown) in roller pattern 38 to form raised areas (not shown) on a patterned surface 42 of substrate 22 and the balance of thermoplastic material 26 is squeezed onto base 28 forming channels (not shown). Accordingly, this forms a pattern channel 40 having channels separated by raised areas (not shown) on a patterned surface 42 of thermoplastic material 26, the arrangement of raised areas and channels in channel pattern 40 is the negative of the arrangement of raised areas and channels found on roller pattern 38. Thermoplastic material 26 is then cooled below a melting temperature of thermoplastic material 26 and substrate 22 is then wound onto a substrate take up roll 44 for further processing as will be described in greater detail below.

FIG. 2 shows another embodiment of an extrusion roll molding apparatus 20 that can be used to form substrate 22. In the embodiment of FIG. 2, extrusion roll molding apparatus 20 comprises an extruder 24 that melts thermoplastic material 26. Melted thermoplastic material 26 supplied by extruder 24 is pressed into nip area 32 between pressure roller 34 and pattern roller 36. Melted thermoplastic material 26 passes material between pressure roller 34 and pattern roller 36 and is cooled below the melting temperature of thermoplastic material 26 to form substrate 22. As melted thermoplastic material 26 is passed through nip area 32 to form substrate 22, a roller pattern 38 on pattern roller 36 is impressed into melted thermoplastic material 26 to form a channel pattern 40 of channels (not shown) separated by raised areas (not shown) on patterned surface 42 of substrate 22 that is the negative of pattern roller 36. Substrate 22 is then wound onto a substrate take up roll 44 for further processing as will be described in greater detail below.

In the embodiment shown, pattern roller 36 comprises a metallic roller such as chrome, copper or stainless steel into which roller pattern 38 is formed. However, in other embodiments, pattern roller 36 can comprise a variety of forms. For example, pattern roller 36 can comprise any type of dimensionally stable roller or drum that is adapted so that a metallic plate, sleeve or other structure (not shown) having roller pattern 38 formed thereon that can be joined to pattern roller 36 to provide a metallic contact surface having the desired roller pattern 38. This allows the same pattern roller 36 to be used in conjunction with many different roller patterns simply by changing the sleeve, metallic plate or other structure having roller pattern 38.

Forming roller pattern 38 on a metallic pattern roller 36 or metallic plate, metallic sleeve or other metallic structure that can be joined to pattern roller 36, provides protection to the precision geometry of roller pattern 38, provides excellent mechanical wear properties and is an excellent conductor of heat and pressure. Roller pattern 38 can be formed on pattern roller 36, a plate, sleeve or other structure by known machining techniques, including but not limited to, techniques such as machining the desired pattern directly into the roller surface utilizing wire EDM tool s, etching the pattern directly into the roller, growing the pattern by use of photolithography, machining the pattern using high energy lasers, diamond milling, ion beam milling or creation of a random pattern by bead blasting the roller followed by chrome plating.

In alternative embodiments, pattern roller 36 or a sleeve, plate or other structure bearing roller pattern 38 can be formed using other non-metallic materials. For example pattern roller 36 can be formed from materials such as ceramics or certain plastics. Roller pattern 38 can be formed in such materials using known techniques including, but not limited to, casting, oblation, ion beam milling, printing and lithographic techniques such as gray scale lithography.

FIGS. 3 and 4 show, respectively, a perspective and cross-section view of an example of substrate 22 formed in accordance with the embodiment of FIG. 1. As is shown in FIG. 3, channel pattern 40 formed on patterned surface 42 of substrate 22 by roller pattern 38 can comprise various shapes, sizes and arrangements intended to facilitate particular electrical, magnetic, mechanical, optical or chemical structures as will be described in greater detail below. Each shape is defined by a raised area 52 and channel 54. FIG. 3 shows examples of only a few of the possible shapes that can be formed on a patterned surface 42 of substrate 22. Other shapes include ordered arrays of triangles, continuous fluidic channels, pyramids, squares, rounded features, cylinders, and complex shapes with multiple sides. In certain embodiments, the separation between raised area 52 and channel 54 can range from 0.1 micrometers to about 100 micrometers, however, in other embodiments the sizes of the separation can range between 0.5 micrometers and 200 micrometers. It has experimentally been found that such extrusion roll molding processes provides precision negative replication of roller pattern 38. For example, it has been shown that where extrusion roll molding is used to form channel pattern 40 on patterned surface 42 of substrate 22, the features of channel pattern 40 typically replicate the dimensions of the features of roller pattern 38 at greater than 95% of the dimensional range. Such precision formation is possible even when forming substrate 22 operating at machine speeds in the 20 to 200 meter/min range. Accordingly, it is possible to reliably and economically form precise arrangements of raised areas 52 and channels 54 in substrate 22. This allows substrate 22 to be used to define a platform for fabricating and assembling a wide variety of useful structures.

Thermoplastic material 26 can comprise a variety of suitable materials. For example, polymers are generally low in cost, and can be efficiently formed into subsequent shapes utilizing known processes such as melt extrusion, vacuum forming and injection molding. Example polymers that can be used for thermoplastic material 26 include polyolefins, cyclo-olefins, polyesters, polyamides, polycarbonates, cellulosic esters, polystyrene, polyvinyl resins, polysulfonamides, polyethers, polyimides, polyvinylidene fluoride, polyurethanes, polyphenylenesulfides, polytetrafluoroethylene, polyacetals, polysulfonates, polyester ionomers, and polyolefin ionomers. Copolymers and/or mixtures of these polymers to can be used to obtain a thermoplastic material 26 having specific mechanical or optical properties. Polyamides that can be used in thermoplastic material 26 include, but are not limited to, nylon 6, nylon 66, and mixtures thereof. Copolymers of polyamides are also suitable continuous phase polymers that can be used in thermoplastic material 26. An example of a useful polycarbonate is bisphenol-A polycarbonate. Cellulosic esters are also suitable for use as thermoplastic material 26 and include cellulose nitrate, cellulose triacetate, cellulose diacetate, cellulose acetate propionate, cellulose acetate butyrate, and mixtures or copolymers thereof. Polyvinyl resins that can be used in thermoplastic material 26 include polyvinyl chloride, poly (vinyl acetal), and mixtures thereof. Copolymers of vinyl resins can also be utilized.

In addition, thermoplastic material 26 can comprise various known polyesters for the polymer features of the invention including those produced from aromatic, aliphatic or cycloaliphatic dicarboxylic acids of 4–20 carbon atoms and aliphatic or alicyclic glycols having from 2–24 carbon atoms. Examples of suitable dicarboxylic acids include, but are not limited to, terephthalic, isophthalic, phthalic, naphthalene dicarboxylic acid, succinic, glutaric, adipic, azelaic, sebacic, fumaric, maleic, itaconic, 1,4-cyclohexanedicarboxylic, sodiosulfoisophthalic and mixtures thereof. Examples of suitable glycols include, but are not limited to, ethylene glycol, propylene glycol, butanediol, pentanediol, hexanediol, 1,4-cyclohexanedimethanol, diethylene glycol, other polyethylene glycols and mixtures thereof.

Addenda is optionally added to thermoplastic material 26 to improve the optical, mechanical, chemical, magnetic or electrical characteristics of channel pattern 40 of raised area 52 and channel 54 formed in thermoplastic material 26. An example of such useful addenda that can be added include, but are not limited to, an optical brightener. An optical brightener is substantially colorless, fluorescent, organic compound that absorbs ultraviolet light and emits it as visible blue light. Examples include, but are not limited to, derivatives of 4,4'-diaminostilbene-2,2'-disulfonic acid, coumarin derivatives such as 4-methyl-7-diethylaminocoumarin, 1-4-Bis (O-Cyanostyryl)Benzol and 2-Amino-4-Methyl Phenol. Other useful addenda that can be added to thermoplastic material 26 include antistatic compounds, pigments, dyes, carbon black, polymer stabilizers or ultraviolet absorbers.

As is described above, substrate 22 has a patterned surface 42 with a channel pattern 40 formed by contact with roller pattern 38. As is shown in FIG. 4, substrate 22 also has a base surface 46 on a side of substrate 22 that is opposite from patterned surface 42. In certain embodiments, base surface 46 can be formed to receive image forming materials such as inks, dyes, toners, and colorants. This permits images to be formed, for example, on base surface 46 using ink jet printing, thermal printing, contact press printing and other techniques. There are various ways in which this can be done.

Where substrate 22 is formed using the extrusion roll molding apparatus described in FIG. 1, base surface 46 is a surface that is a component of base 28. Accordingly, base 28 can be formed from a material that is adapted to receive image forming materials. Alternatively, base 28 can also be formed from a material that forms images when exposed to energy such as thermal, electrical, optical, electromagnetic or other forms of energy. Similarly, where substrate 22 is formed using the extrusion roll molding apparatus described in FIG. 2, base surface 46 is formed from thermoplastic material 26. Accordingly, in such an embodiment, a thermoplastic material 26 can be used that is capable of receiving image forming materials or that is capable of forming an image when exposed to energy. In still another alternative embodiment, base surface 46 can be adapted by chemical or other treatments or coatings to receive image forming materials or to form images when exposed to energy.

In the embodiment shown in FIGS. 3 and 4, substrate 22 has a thickness between base surface 46 and channels 54 of approximately 100 microns. This provides rigidity and structure to substrate 22 that enables channel pattern 40 to maintain dimensional stability. However, in certain applications, channel pattern 40 can contain one or more channels 54 that are separated from base surface 46 to a different degree and can form a passage through substrate 22 and define an opening at base surface 46.

Channel pattern 40 formed on substrate 22 can also optionally be coated with coatings that improve the optical, physical, electrical or chemical characteristics of raised areas 52 and channels 54. Examples of such coatings include urethane for scratch resistance, hard coats, antiglare coatings, antireflection coatings, antistatic materials and dyes for changing the color of the polymer features. Coating methods that can be used to apply such coatings include, but are not limited to, roll coating, slit die coating, gravure coating, curtain coating, and ink jet coating. Such coatings can be applied in a uniform, random or controlled pattern.

Using Substrate to Form a Medium

It will be appreciated that channel pattern 40 can be used to form a precise arrangement of shapes on substrate 22 at convenient mass production speeds. There are various ways in which this structure can be used. The following will describe the use of substrate 22 having a channel pattern 40 that enable the formation of precise structures on substrate 22 to form a medium having a memory and communication system incorporated in the medium.

Figure 5:
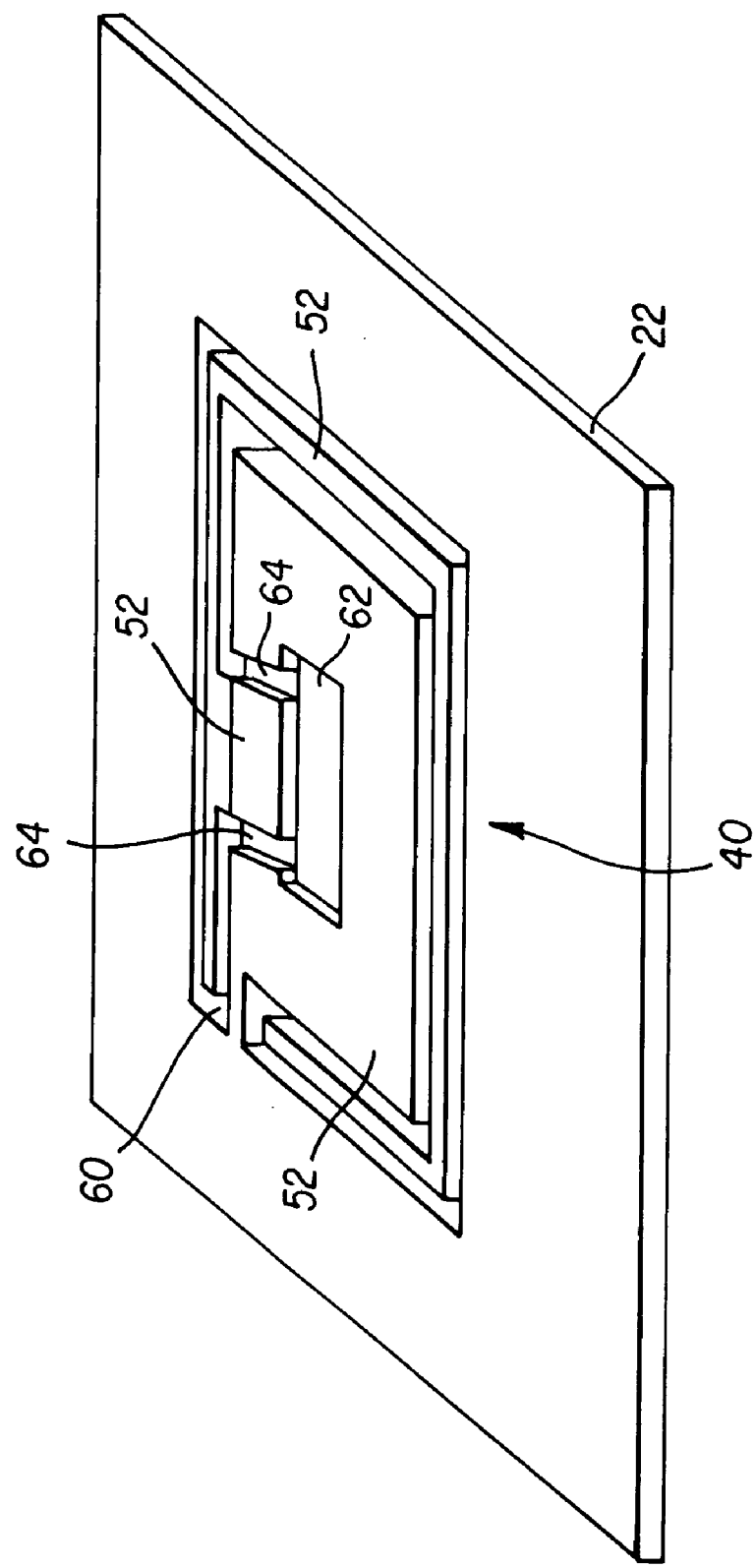
FIG. 5 shows one embodiment of a substrate having a channel pattern with antenna channels, a transponder channel and junction channels.
Figure 6:
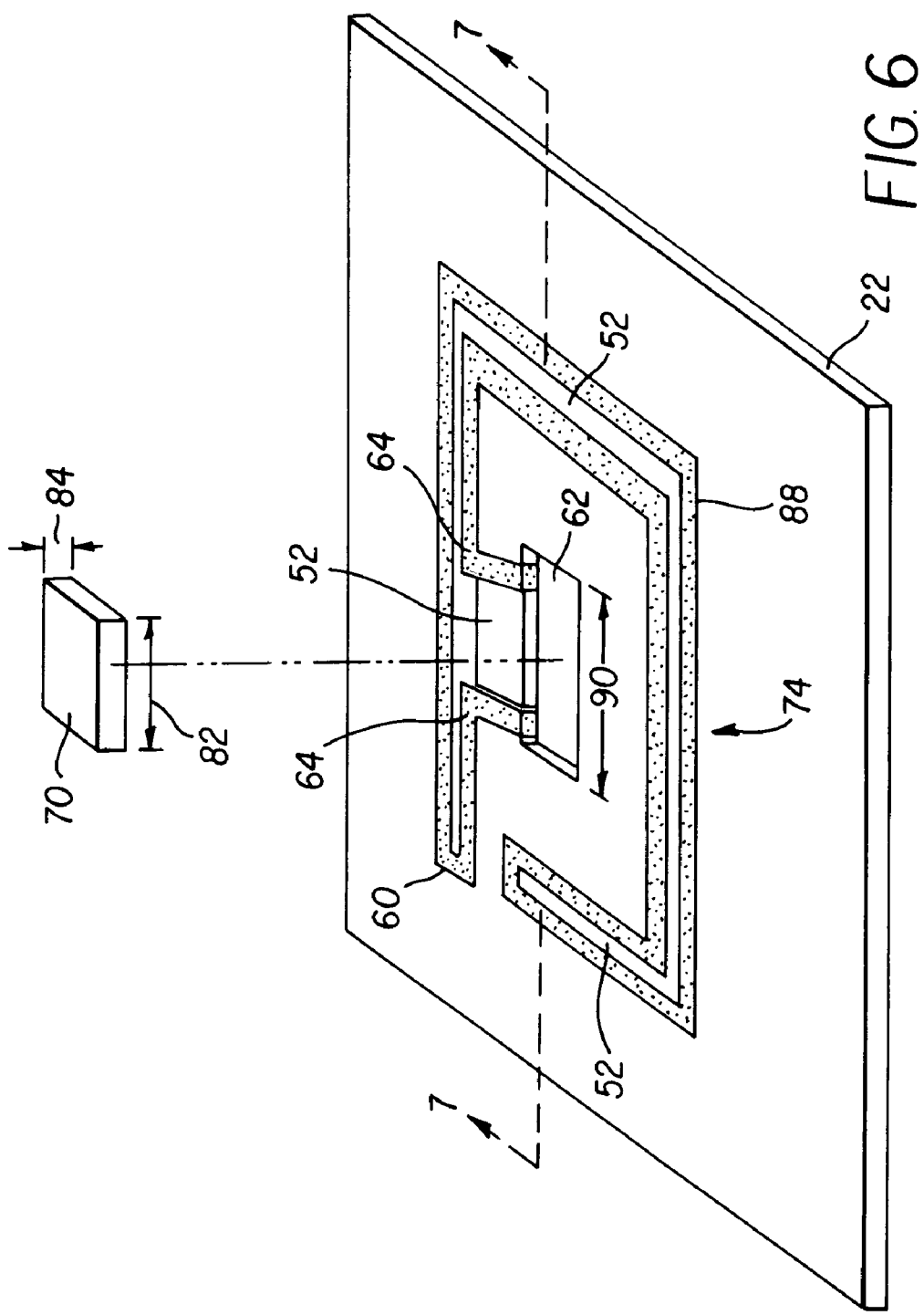
FIG. 6 shows a perspective view of the substrate of FIG. 5 with antenna channels formed thereon.
Figure 7:
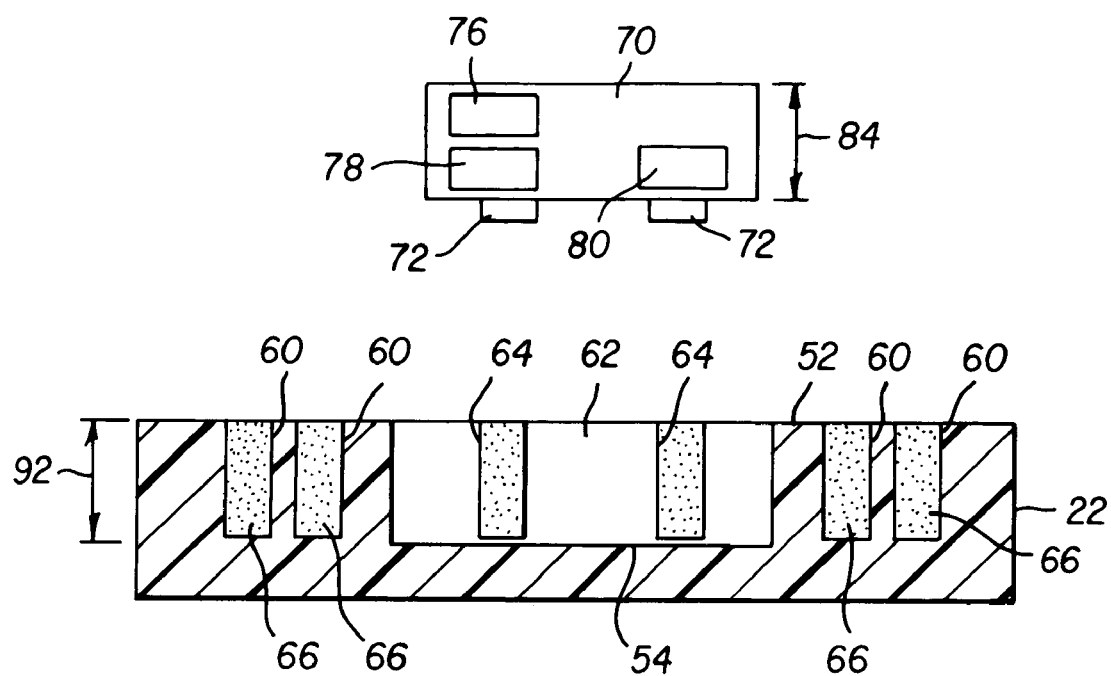
FIG. 7 shows a cross section view of the embodiment of FIG. 6.

FIG. 5 shows one embodiment of substrate 22 that has a channel pattern 40 with antenna channels 60, a transponder channel 62 and junction channels 64 joining the antenna channels 60 to transponder channel 62. As is shown in FIGS. 6 and 7, an antenna 74 is formed on substrate 22 by filling antenna channels 60 and junction channels 62 with a conductive material 66. As will be described later, conductive material 66 is applied to substrate 22 using a coating process. Various coating methods can be used to apply conductive material 66 to substrate 22, some of these will be described in greater detail below, however, by way of example, these coating techniques include, but are not limited to, roll coating, slit die coating, gravure coating, curtain coating, and ink jet coating. Using any of these coating methods, a layer of conductive material 66 and any appropriate solvents, carriers or other materials can be coated into channel pattern 40 on substrate 22.

Conductive material 66 typically can comprise any conductive material. Examples of such materials include metals such as copper, aluminum and other materials having electrically conductive properties. As will be discussed in greater detail below, other materials can also be used for conductive material 66.

Conductive material 66 can be applied from either aqueous or organic solvent coating formulations using any of the known coating techniques such as roller coating, gravure coating, air knife coating, rod coating, extrusion coating, blade coating, curtain coating, slide coating, and the like. Specific examples of such coating techniques are described in greater detail below. Other known coating and drying methods are described in further detail in Research Disclosure No. 308119, (Published December 1989, pages 1007 to 1008. After coating, conductive material 66 is generally dried by simple evaporation, which can be accelerated by known techniques such as convection heating. One method for coating conductive material 66 onto substrate 22 and into channel pattern 40 is to coat conductive material 66 into the conduits by roll coating conductive material 66 into substrate 22 followed by removal of conductive material 66 located at raised areas 52 of channel pattern 40 by a scraping blade or reverse roll contacting the peaks of the conduits. Typically, conductive material 66 is heated to a state that allows conductive material 66 to be coated onto channel pattern 40 of substrate 22. Alternatively, conductive material 66 can be combined with other materials to facilitate application of conductive material 66 to substrate 22 during the coating process. Examples of such other materials include plastics, solvents, carriers, binders and/or other materials.

During coating, conductive material 66 flows into antenna channels 60, transponder channel 62 and junction channels 64 and at least partially fills these channels. Conductive material 66 is allowed to solidify for example as a result of the cooling of conductive material 66, the evaporation of solvents or carriers, or the application of a curative agent or energy source that activates a binder. The coating process is typically applied so that conductive material 66 flows or is mechanically scraped off of raised surfaces 52 and into channels 54. Once solidified, conductive material 66 provides an antenna 74 and other electrical circuit components such as electrical pathways and components.

In the embodiments of FIGS. 5–9, substrate 22 has a transponder channel 62 that is adapted to receive a transponder 70. In one embodiment of the present invention, transponder 70 is provided in transponder channel 62 prior to the application of the coating of conductive material 66. Transponder 70 has antenna engagement surfaces 72 adapted to engage antenna 74 or an electrical path leading to antenna 74. When conductive material 66 is applied, the conductive material 66 in junction channel 64 joins to the antenna engagement surfaces 72 of transponder 70 while conductive material 66 is still in a fluid or semi-fluid state. When conductive material 66 solidifies to form an antenna 74, conductive material 66 in junction channel 64 forms an electrical connection with antenna engagement surfaces 72. In an alternative embodiment, transponder 70 is positioned in transponder channel 62 after coating. This can occur, for example, before the coating of conductive material 66 has solidified.

Alternatively, transponder 70 can be joined to the coating of conductive material 66 after conductive material 66 has solidified to form antenna 74. In this regard, transponder 70 can be mechanically pressed into contact with the conductive material 66 in junction channels 64 to form an electrical connection. In still another alternative, junction channels 64 can be omitted and antenna engagement surfaces 72 can be pressed directly into contact with antenna 74.

Using the electrical connection between transponder 70 and antenna 74, a power supply circuit 76 in transponder 70 can receive electromagnetic signals and convert such signals into power to operate the transponder 70. When transponder 70 is operated, a radio frequency communication circuit 78 transmits radio frequency signals that contain data that is stored in a memory 80. Radio frequency communication circuit 78 can also be adapted to use the electrical connection between antenna engagement surfaces 72 and antenna 74 to receive radio frequency signals having data and to store the data from such signals in memory 80. In alternative embodiments, antenna 74 can be omitted where transponder 70 contains an integral antenna.

In the embodiment shown in FIGS. 6 and 7 transponder channel 62 has a width dimension 90 that is at least equal to a width dimension 82 of transponder 70. Alternatively, where substrate 22 is formed from a material having a degree of elasticity, width dimension 90 of transponder channel 62 can be undersized with respect to width dimension 82 of transponder 70. Where transponder channel 62 is undersized, insertion of transponder 70 into transponder channel 62 causes deformation of raised areas 52 of substrate 22 proximate to transponder channel 62 to allow transponders 70 to be inserted into transponder channel 62. However, thermoplastic material 26 in raised areas 52 of substrate 22 proximate to transponder channel 62 resists this deformation and applies a force against transponder 70. This force tends to hold transponder 70 within transponder channel 62 and can be used to hold transponder 70 so that antenna engagement surfaces 72 remain in contact with antenna 74 and hold transponder 70 in transponder channel 62, for example, during a coating operation where transponder 70 is positioned in the transponder channel 62 prior to coating. A medium 99 is formed when transponder 70 is joined to substrate 22 and forms an electrical connection with conductive material 66.

FIGS. 8 and 9 show medium 99 having a transponder 70 with a memory 80, an antenna 74 and an electrical connection between transponder 70 and antenna 74 defined by conductive material 66 in junction channel 64. As is shown in this embodiment, raised areas 52 are separated from channels 54 by a distance 92 that is at least as great as a thickness 84 of transponder 70. Further, in this embodiment, antenna channels 60, and junction channel 64 can be filled with conductive material 66 to a level that fills antenna channels 60 and junction channels 64 are also filled to the level of raised areas 52. In this way, raised areas 52 and an outer surface 86 of transponder 70 and outer surfaces 88 of conductive material 66 form a common plane A—A to provide a level surface that can be processed without risk of interference with later material handling. This permits the use of useful medium fabrication processes such as rolling or extrusion after transponder 70 has been joined to substrate 22 and lowers the risk damage to previous and/or subsequently applied layers of where medium 99 is wound onto rolls for storage or during further processing.

In certain embodiments it can be desirable for medium 99 to be transparent. In these embodiments a substrate can be formed from transparent thermoplastic material 126 and conductive material 66 can be used that provides such transparency or substantially transparent, not withstanding the presence of conductive material 66 by providing very thin layers of such metals. Other materials can also be used for conductive material 66, some of which can be made transparent in relatively thicker applications. As used herein, the term "Transparent" describes the ability of a medium to transmit "light" that is in the visible range and describes a condition where the total light transmission of the medium is 75% or greater at 500 nm. The term "diffuse light transmission" means the percentage of diffusely transmitted light at 500 nm as compared to the total amount of light at 500 nm of the light source. The term "total light transmission" means percentage of light transmitted through the sample at 500 nm. This includes both spectral and diffuse transmission of light. The term "diffuse light transmission efficiency" means the ratio of the percentage of diffuse transmitted light at 500 nm to the percentage of total transmitted light at 500 nm multiplied by a factor of 100.

Having a transparent conductive material 66 is particularly useful because the layers behind it such as substrate 22, and/or base 28 can still be seen.

Various conductive materials can be used for conductive material 66 that have a high visible light transmission characteristically useful in providing essentially transparent conductive pathways for use in forming antennas and other structures in a medium for example, conductive polymers can be used. Such "polymers" include homo- and co-polymers and such polymers can be selected from the group consisting of substituted or unsubstituted aniline containing polymers, substituted or unsubstituted pyrrole containing polymers, substituted or unsubstituted thiophene containing polymers. The above polymers provide the desired conductivity, adhesion to other layers in the validation device and have high light transmission. Conductive material 66 can also be coated from a coating composition comprising a polythiophene/polyanion composition containing an electrically conductive polythiophene with conjugated polymer backbone component and a polymeric polyanion component. A preferred polythiophene component for use in accordance with the present invention contains thiophene nuclei substituted with at least one alkoxy group, e.g., a C1–C12 alkoxy group or a —O(CH2H2O)n CH3 group, with n being 1 to 4, or where the thiophene nucleus is ring closed over two oxygen atoms with an alkylene group including such group in substituted form. The preparation of electrically conductive polythiophene/polyanion compositions and of aqueous dispersions of polythiophenes synthesized in the presence of polyanions, as well as the production of antistatic coatings from such dispersions is described in EP 0 440 957 (and corresponding U.S. Pat. No. 5,300,575), as well as, for example, in U.S. Pat. Nos. 5,312,681; 5,354,613; 5,370,981; 5,372,924; 5,391,472; 5,403,467; 5,443,944; and 5,575,898, the disclosures of which are incorporated by reference herein. These polythiophene/polyanion compositions are commercially available.

Electrically-conductive polythiophene/polyanion polymer compositions that can also be used to form conductive material 66 include 3,4-dialkoxy substituted polythiophene/poly(styrene sulfonate), with the most preferred electrically-conductive polythiophene/polyanion polymer composition being poly(3,4-ethylene dioxythiophene)/poly(styrene sulfonate), which is available commercially from Bayer Corporation as Baytron P.

In another embodiment, conductive material 66 can comprise pentacene. Pentacene is usefully employed because it is electrically conductive, can be made transparent, has high electron mobility and can easily be coated into channels 54 by known methods such as roll coating and doctor blade coating and other coating techniques, some of which are described in greater detail below.

In other embodiments, conductive material 66 can comprise materials that can be transferred such as those that that have been described for use in the photographic film arts to dissipate static charge. In this regard, ionic conductors such as conjugated conducting polymers, conducting carbon particles, crystalline semiconductor particles, and amorphous semiconductive fibrils can be used. Alternatively, continuous semi-conducting thin films can be used more effectively than ionic conductors to conduct charge since their electrical conductivity is independent of relative humidity and only slightly influenced by ambient temperature.

In still other embodiments, electrically conducting metal-containing particles, such as semi-conducting metal oxides, are particularly effective when dispersed in suitable polymeric film-forming binders in combination with polymeric non-film-forming particles as described in U.S. Pat. Nos. 5,340,676; 5,466,567; 5,700,623. Binary metal oxides doped with appropriate donor heteroatoms or containing oxygen deficiencies have been disclosed in prior art to be useful in antistatic layers for photographic films, for example, U.S. Pat. Nos. 4,275,103; 4,416,963; 4,495,276; 4,394,441; 4,418,141; 4,431,764; 4,571,361; 4,999,276; 5,122,445; 5,294,525; 5,382,494; 5,459,021; 5,484,694 and others. Suitable conductive metal oxides include: zinc oxide, titania, tin oxide, alumina, indium oxide, silica, magnesia, zirconia, barium oxide, molybdenum trioxide, tungsten trioxide, and vanadium pentoxide. Preferred doped conductive metal oxide granular particles include antimony-doped tin oxide, fluorine-doped tin oxide, aluminum-doped zinc oxide, and niobium-doped titania. Additionally conductive ternary metal oxides disclosed in U.S. Pat. No. 5,368,995 include zinc antimonate and indium antimonite can be used for conductive material 66. Other conductive metal-containing granular particles including metal borides, carbides, and nitrides have been disclosed in Japanese Kokai No. JP 04-055,492 and can be used for conductive material 66.

Yet another type of material that can be used for conductive material 66 is described in U.S. Pat. No. 6,096,491 which describes imaging elements, including motion imaging films, containing an electrically conductive layer protected under an abrasion resistant topcoat. The electrically-conductive layer may comprise an electrically conductive 3,4-dialkoxy substituted polythiophene styrene sulfonate complex.

Any polymeric film-forming binder, including water soluble polymers, synthetic latex polymers such as acrylics, styrenes, acrylonitriles, vinyl halides, butadienes, and others, or water dispersible condensation polymers such as polyurethanes, polyesters, polyester ionomers, polyamides, epoxides, and the like, may be optionally employed in the conductive material 66 to improve integrity of conductive material 66 and to improve adhesion of the conductive material 66 to an underlying and/or overlying layer. Preferred binders include polyester ionomers, vinylidene chloride containing interpolymers and sulfonated polyurethanes as disclosed in U.S. Pat. No. 6,124,083 incorporated herein by reference. The electrically-conductive polythiophene/polyanion composition to added binder weight ratio can vary from 100:0 to 0.1:99.9, preferably from 1:1 to 1:20, and more preferably from 1:2 to 1:20. The dry coverage of the electrically-conductive substituted or unsubstituted thiophene-containing polymer employed depends on the inherent conductivity of the electrically-conductive polymer and the electrically-conductive polymer to binder weight ratio. A preferred range of dry coverage for the electrically-conductive substituted or unsubstituted thiophene-containing polymer component of the polythiophene/polyanion compositions is from about 0.5 mg/m.sup.2 to about 3.5 mg/m.sup.2. This dry coverage should provide the desired electrical resistivity values before and after photographic processing while minimizing the impact of the electrically-conductive polymer on the color and optical density of the processed photographic element.

In addition to the electrically-conductive agent(s) and polymeric binder, the conductive material 66 of the invention may include crosslinking agents, coating aids and surfactants, dispersing aids, coalescing aids, biocides, matte particles, waxes and other lubricants. A common level of coating aid in the conductive coating formula, e.g., is 0.01 to 0.3 weight % active coating aid based on the total solution weight. These coating aids are typically either anionic or nonionic and can be chosen from many that are applied for aqueous coating. The various ingredients of the coating solution may benefit from pH adjustment prior to mixing, to insure compatibility. Commonly used agents for pH adjustment are ammonium hydroxide, sodium hydroxide, potassium hydroxide, tetraethyl amine, sulfuric acid, acetic acid, etc.

FIGS. 10–16 show various embodiments of coating methods that can be used to apply conductive material 66 to substrate 22. FIGS. 10 and 11 show one example of a gap coating method. In this method, a supply 100 of conductive material 66 is applied to substrate 22 using a convenient means adapted for such material. Substrate 22 and the supply of conductive material 66 applied to web substrate 22 are passed between a roller 102 and limiting structure 104 such as a knife. As conductive material 66 and substrate 22 pass between roller 102 and limiting structure 104, limiting structure 104 removes excess conductive material 66 from raised areas 52. Conductive material 66 is then permitted to solidify. This provides a medium 99 having a transponder 70 with an antenna 74 and a uniform outer surface 106.

Figure 12:
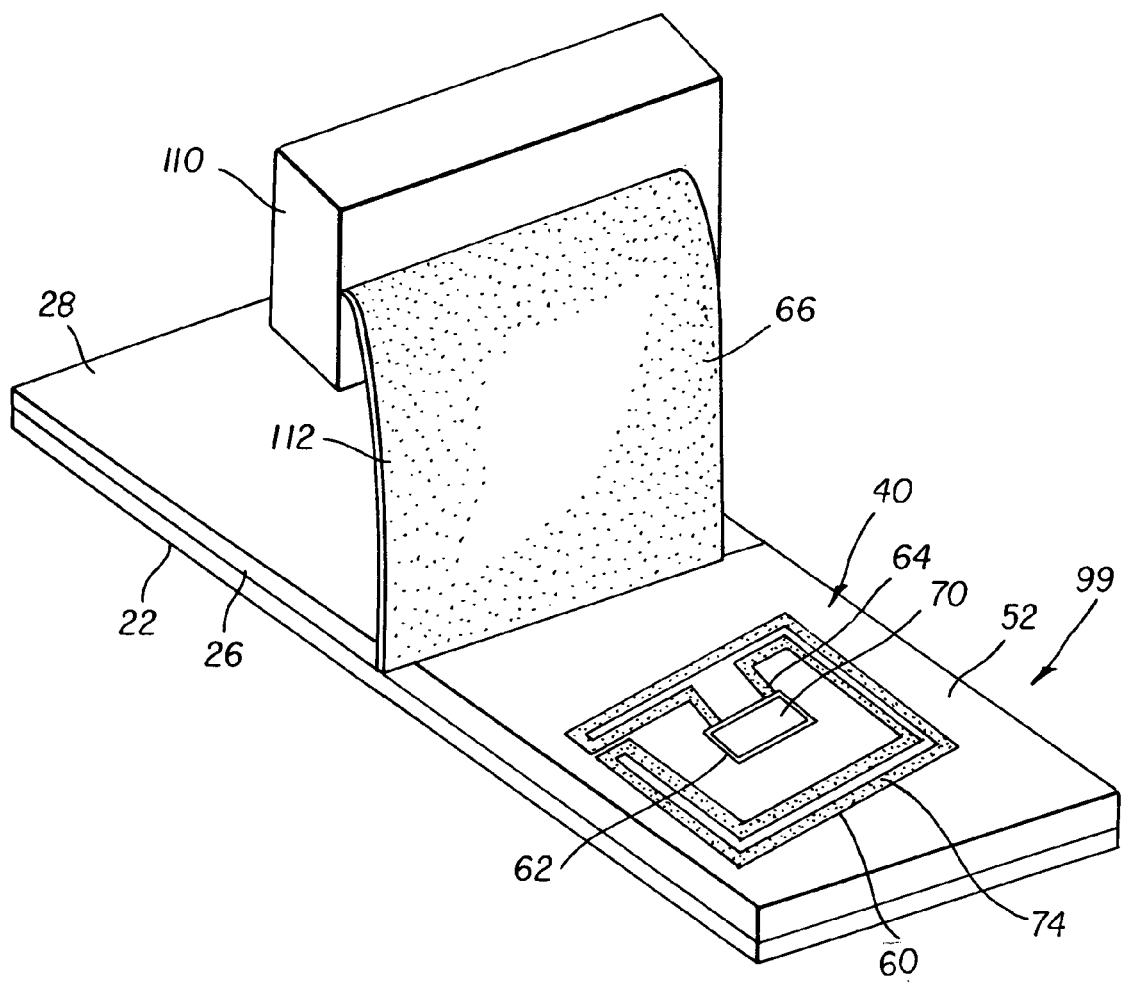
FIG. 12 is another embodiment of a coating method.

FIG. 12 shows another embodiment of a method for coating conductive material 66 onto substrate 22. This coating method is known as curtain coating. In curtain coating, conductive material 66 is processed to a liquid form and flows from a supply 110 in a continuous curtain 112 onto substrate 22 as substrate 22 is passed through curtain 112. When this occurs, conductive material 66 flows off of raised area 52 into channel 54 such as antenna channel 60, transponder channel 62 and junction channel 64.

FIGS. 13 and 14 show still another embodiment of a method for coating a substrate 22. In this embodiment, a technique known as slot die coating is used. In this technique, a supply 120 has a slot 122 that ejects conductive material 66 onto patterned surface 42 of substrate 22 to fill or at least partially fill channel 54 such as antenna channel 60, transponder channel 62 and/or junction channel 64.

It will be appreciated that other techniques can also be used to apply conductive material to fill or at least partially fill channel 54 of channel pattern 40 formed on substrate 22 including but not limited to spraying and printing conductive material 66 onto substrate 22.

Figure 15:
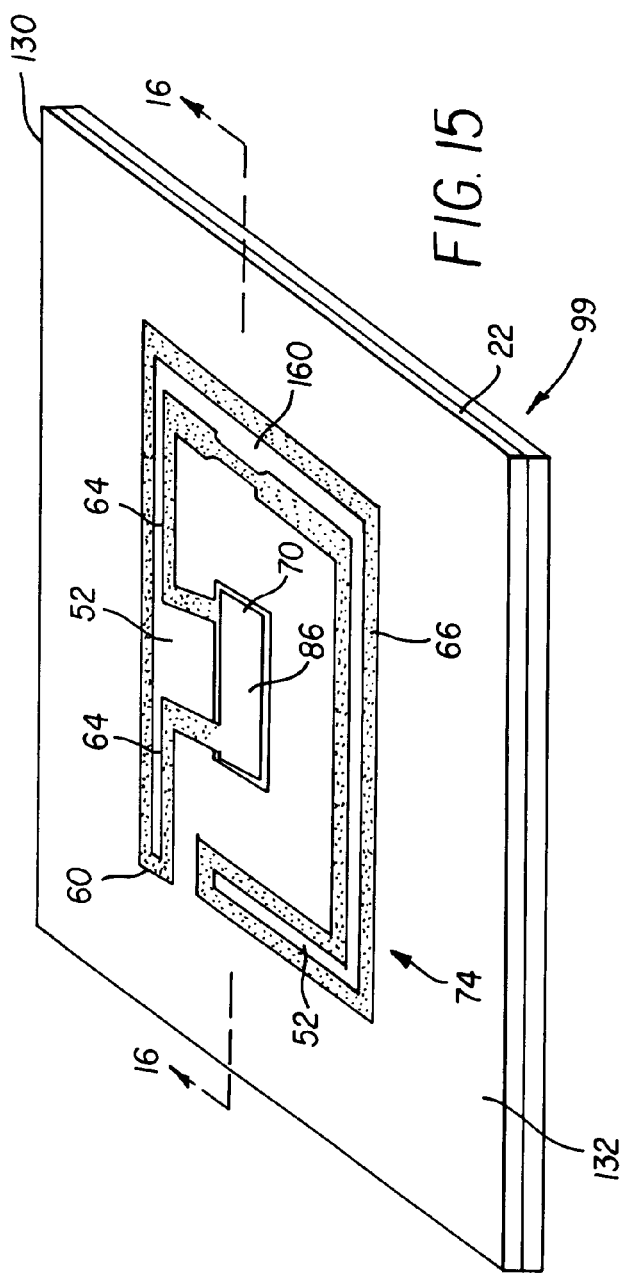
FIG. 15 shows another embodiment of the medium in accordance with the present invention.
Figure 16:
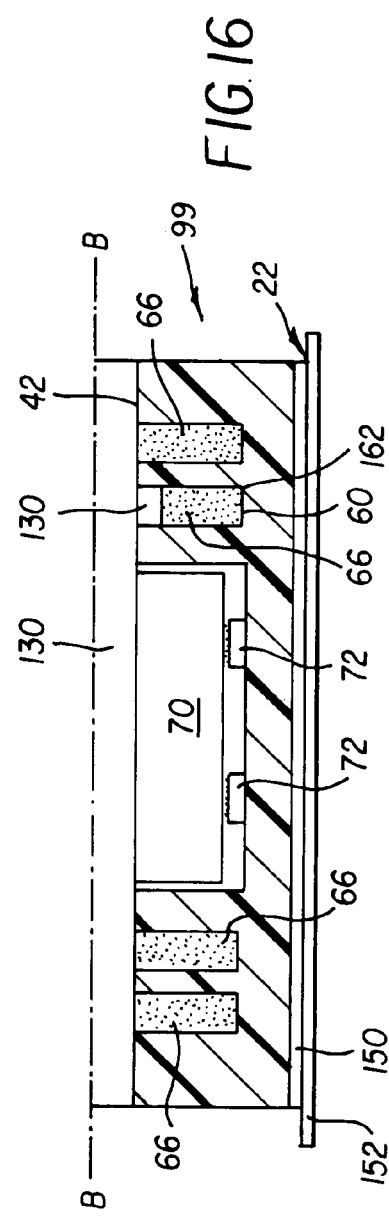
FIG. 16 shows a cross section view of the medium shown in FIG. 15.

As is shown in FIGS. 15 and 16, in another embodiment, an overcoat layer 130 can be applied to medium 99. Overcoat layer 130 secures transponder 70 and antenna 74 in medium 99. Further, overcoat layer 130 can be adapted to prevent conductive material 66 from being exposed after overcoat layer 130 has been applied. Overcoat layer 130 can also be adapted to receive image-forming materials. In the embodiment that is shown in FIGS. 15 and 16, overcoat layer 130 is applied to form an outer surface 132 along plane B—B that does not have protrusions or other non-uniform areas. Overcoat layer 130 can also be adapted to cushion and protect transponder 70, antennas 74 and medium 99 from chemical, thermal, radiation or mechanical damage during handling or manipulation of medium 99. In the embodiment shown in FIGS. 15 and 16, overcoat layer 130 is shown as being transparent, however, in other embodiments, overcoat layer 130 can comprise a non-transparent material. To enhance adhesion of the overcoat layer 130 to conductive material 66, overcoat layer 130 can have a surface energy that is greater than 44 dynes per $cm^2$.

Where an overcoat layer 130 is used, separation 92 between raised areas 52 and channels 51 is at least as great as the thickness 79 of transponder 70 to achieve an outer surface having a common plane. This is because a common plane e.g. B—B, can be formed by an outer surface 132 of overcoat layer 130 wherein overcoat layer 130 applied to a thickness that, in combination with a distance 92 of a substrate 22 is at least co-extensive with the thickness of transponder 70. Further, overcoat layer 130 can be used to form a common plane B—B on medium 99 even where, as is shown in FIG. 16, one or more of channels 54 is only partially filled with conductive material 66.

Where substrate 22 has raised areas 52 that are adapted to receive image forming materials, such image forming materials can be applied to form images on patterned surface 42 before overcoat layer 130 is formed. In one such embodiment, overcoat layer 130 can comprise a transparent material that blocks the flow of ultraviolet or other forms of radiation, that provides protection against mechanical, thermal, chemical or other factors that may damage the appearance of the images formed on substrate 22.

FIGS. 15 and 16 show another optional feature in that the embodiment shown in these figures has an adhesive layer 150 that can be applied to base surface 46 or patterned surface 42 of medium 99 to permit medium 99 to be easily applied to a tangible thing such as a bottle. An advantage of such a medium is that a label can be provided that does not have a protrusion that might interfere with or be easily damaged by use and handling of the tangible thing to which medium 99 is attached. To facilitate handling of this adhesive embodiment of medium 99, a removable layer 152 can be applied to adhesive layer 150. Adhesive layer 150 can comprise a pressure sensitive adhesive. One example of such a pressure sensitive adhesive is clear polymer such as acrylic or urethane. Temperature and chemical resistance in the adhesive is also preferred as medium 99 may be subjected to temperatures in excess of 80 degrees C. and exposed to caustic chemistry. The pressure sensitive adhesive is preferably applied to base surface 46 opposite the pattern formed on substrate 22 to allow channel pattern 40 to be exposed.

Figure 17:
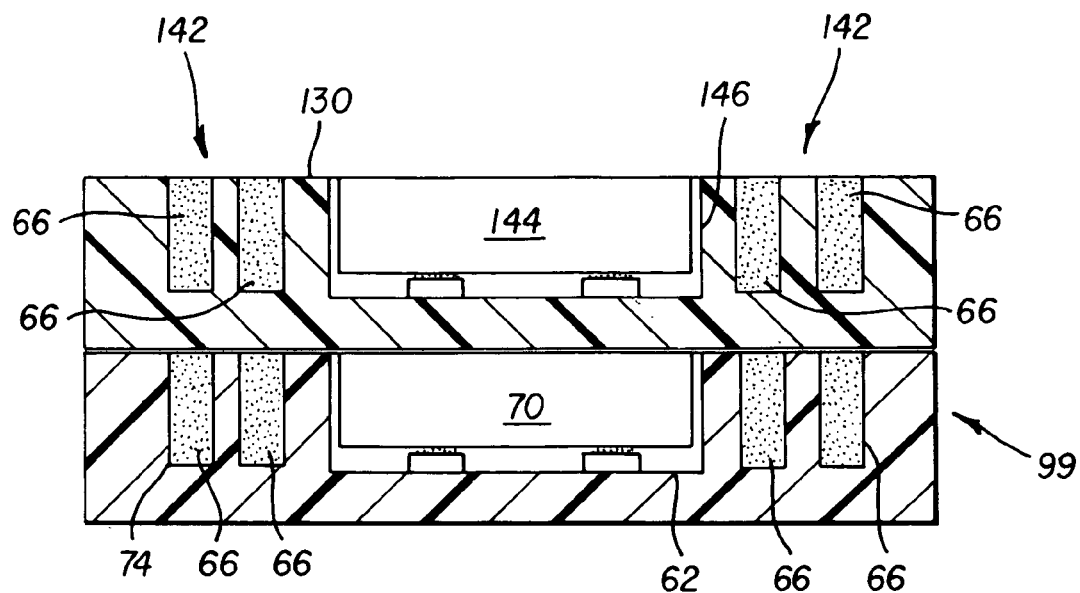
FIG. 17 shows yet another embodiment of a medium in accordance with the present invention.

As is shown in FIG. 17, overcoat layer 130 can also comprise a second patterned surface 140 in which a second antenna 142 and second transponder 146 can be formed using the techniques described above. It this way, media can be assembled having multiple layers of transponders or other electronic components. This allows for multi-dimensional components to be assembled in medium 99. Such components include, but not limited to, structures such as inductors and capacitors.

Figure 18:
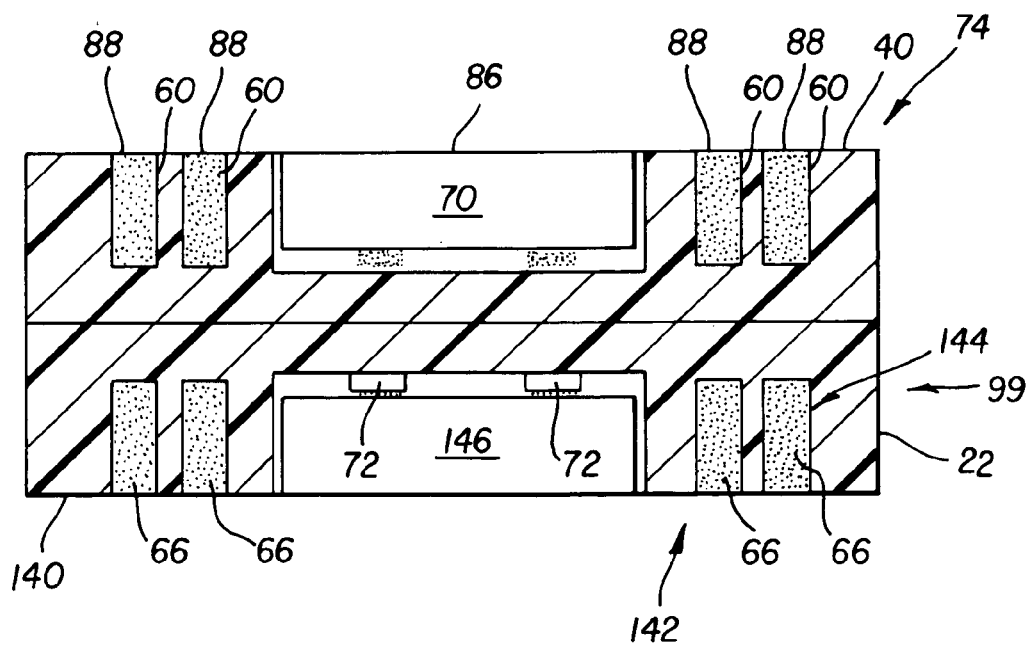
FIG. 18 shows yet another embodiment of a medium in accordance with the present invention.

As is shown in FIG. 18, substrate 22 can comprise both a patterned surface 42 and a second patterned surface 140 and have a base channel pattern 142 in which a second antenna 144 and second transponder 146 can be provided. Conveniently, substrate 22 can be formed using the embodiment of FIG. 1 or 2 with a pressure roller 34 that has a base roller pattern (not shown) that impresses a second patterned surface into base surface 46. Similarly, second antenna 144 can be formed in the second patterned surface 140 using the same coating techniques described above. Further, a second transponder 146 can also be applied in the manner described above.

Using the above described methods, medium 99 is formed having a transponder 70 with an antenna 74 and a memory 80 formed therein. In certain embodiments, the dimensions of medium 99 have been defined to ensure that medium 99 is free of protrusions and provides uniform outer surfaces. This permits medium 99 to be further processed as necessary using conventional web forming techniques such as winding, rolling, extruding and printing. For example, medium 99 having multiple transponders 70 attached thereto can be slit and wound onto rolls with each roll having at least one transponder 70. Medium 99 can also be slit and chopped into sheet form with each sheet having a transponder 70 associated therewith. It will be appreciated however, that this is an optional fraction.

In any embodiment described above, transponder 70 can be formed in whole or in part by defining channel pattern 40 on substrate 22 that is adapted to receive conductive material 66 and to arrange the received conductive material 66 to form useful components of transponder 70 including, but not limited to, components of the power supply circuit 76, radio frequency circuit 78 and memory 80. In this regard substrate 22 can have a channel pattern 40 with channels 54 adapted to receive discrete components and other channels adapted to provide electrical pathways between the discrete components and other discrete components when conductive material 66 is deposited therein. For example, as is shown in FIGS. 15 and 16, a resistor 160 can be formed by providing a resistor channel 162 having a reduced cross sectional area relative to other channels or by only partially filling a channel with conductive material 66. As is shown in FIGS. 19 and 20, the cross sectional area for resistor 160 is provided by reducing a width dimension 164 of resistor channel 162 and a depth dimension 166 which is the overall separation between the resistor channel 162 and adjacent raised portions 168. An electrically resistive material can be applied to antenna material 62 in the area of resistor 160.

Further conductive material 66 can form other components such as a capacitor (not shown) by applying conductive material 66 along parallel channels separated by a relatively thin raised area 52. Other circuit components of transponder 70 can be formed in like fashion. From this, it will be appreciated that the shape of channel 54 can be adjusted to provide a gradient, step or other variation in three dimensional space within channel pattern 40. Depth dimension 166 of channels 54 can be varied to accommodate structures such as transponder 70, a capacitor (not shown) or other preformed components that can be assembled to substrate 22 to cooperate with transponder 70. Further, channel pattern 40 on substrate 22 can be defined so that entire circuits such as power supply circuit 76, radio frequency communication circuit 78 and/or memory 80, are formed by the application of conductive material 66 to channel pattern 40.

It will be appreciated that in the embodiments shown and described above, the overall thickness of conductive material 66 and medium thickness 84 can be made thin. For example, the thickness of channel 54 as defined by the separation between channel 54 and adjacent raised area 52, or the thickness of conductive material 66 applied in channel 54 can be made thin such as in the range of 1 to 20 microns which is a significant improvement over the minimum trace thickness of 25 microns typically used in forming conductive patterns using conductive inks.

It will also be appreciated that in accordance with the present invention, the density of channels can be significantly greater than is practical in systems that form conductive patterns using conductive inks. This is because the dimensional stability of roller pattern 40 and the dimensional accuracy of the placement of channel 54 permits highly accurate placement of the conductive channels without risk of bleeding created when conductive ink is used to form circuit patterns on a substrate. Another advantage of the use of channel 54 to determine electrical pathways in medium 99 is that channel 54 protects and separates the conductive material 66 from incidental abrasive damage that can significantly reduce the performance of antennas and other conductors. A further advantage of the use of channel 54 to define electrical pathways is that the raised areas 52 between channel 54 can serve to provide a dielectic material useful in forming advanced components such as capacitors on substrate 22.

The invention has been described in detail with particular reference to certain preferred embodiments thereof, but it will be understood that variations and modifications can be effected within the spirit and scope of the invention.

| PARTS LIST | |
|---|---|
| 20 | extrusion roll molding apparatus |
| 22 | substrate |
| 24 | extruder |
| 26 | thermoplastic material |
| 28 | base |
| 30 | base supply roll |
| 32 | nip area |
| 34 | pressure roller |
| 36 | pattern roller |
| 38 | roller pattern |
| 40 | channel pattern |
| 42 | patterned surface |
| 44 | substrate take up roll |
| 46 | base surface |
| 50 | pattern |
| 51 | channels |
| 52 | raised area |
| 54 | channel |
| 60 | antenna channel |
| 62 | transponder channel |
| 64 | junction channel |
| 66 | conductive material |
| 70 | transponder |
| 72 | antenna engagement surfaces |
| 74 | antenna |
| 76 | power supply circuit |
| 78 | radio frequency communication circuit |
| 79 | thickness |
| 80 | memory |
| 82 | width dimension |
| 84 | medium thickness |
| 86 | outer surface of transponder |
| 88 | outer surface |
| 90 | width dimension |
| 92 | separation |
| 99 | medium |
| 100 | supply |
| 102 | roller |
| 104 | limiting structure |
| 106 | outer surface |
| 110 | supply |
| 112 | curtain |
| 120 | supply |
| 122 | slide |
| 130 | overcoat layer |
| 132 | outer surface |
| 140 | second patterned surface |
| 142 | base channel pattern |
| 144 | second antenna |
| 146 | second transponder |
| 150 | adhesive layer |
| 152 | removable layer |
| 160 | resistor |
| 162 | resistor channel |
| 164 | width dimension |
| 166 | depth dimension |
| 168 | adjacent raised portions |

What is claimed is:

1. A method for forming a medium comprising the steps of:

forming a substrate having a patterned surface with a channel pattern thereon;

providing a transponder having a memory in the channel pattern;

depositing a conductive material in the channel pattern with the conductive material operatively associated with the transponder;

applying an overcoat to the patterned surface, the overcoat layer having a bottom surface in contact with the patterned surface of the substrate and a top surface having an overcoat channel pattern formed therein; and depositing a conductive material in the overcoat channel pattern, wherein the overcoat comprises at least one contact aperture between the conductive material in the channel pattern on the substrate and the conductive material of the overcoat channel pattern whereby conductive material in the channel pattern on the substrate can electrically engage conductive material from the overcoat channel pattern.

2. The method of claim 1 wherein the transponder has a thickness within a predefined range and wherein the step of forming the channel pattern comprises forming at least one channel having a depth that is greater than the thickness of the transponder and adapted to receive the transponder.

3. The method of claim 1, wherein a portion of the channel pattern has a width dimension that is smaller in size than a width dimension of the transponder and the step of providing the transponder in the channel pattern recess comprises elastically deforming the substrate in the smaller portion to receive the transponder.

4. The method of claim 1 further comprising the step of providing an overcoat layer on at least one side of the substrate said overcoat layer adapted to permit the formation of an image thereon.

5. The method of claim 1, further comprising the step of providing an overcoat layer on at least one of the substrate, channel pattern, conductive material and transponder.

6. The method of claim 1, further comprising the step of providing an overcoat layer on at least one of the substrate, channel pattern, conductive material and transponder the overcoat layer having a surface energy that is greater than 44 dynes per cm$^2$.

7. The method of claim 1, further comprising the step of providing an overcoat layer on at least one of the substrate, channel pattern, conductive material and transponder to form a generally uniform outer surface.

8. The method of claim 1, further comprising the step of providing an overcoat layer on at least one of the channel pattern, conductive material and transponder to form a generally uniform outer surface adapted to receive an image.

9. The method of claim 1, further comprising the step of providing an overcoat layer on the channels, the substrate, the transponder, and the conductive material with the overcoat layer adapted to permit the formation of an image thereon.

10. The method of claim 1, wherein the substrate is formed from a material upon which an image can be formed.

11. The method of claim 1, wherein at least a portion of the channel pattern forms an antenna pattern so that an antenna is formed by conductive material deposited in the antenna pattern.

12. The method of claim 1, wherein the conductive material is optically transparent.

13. The method of claim 1, wherein the conductive material has a light transmission of at least 75%.

14. The method of claim 1, wherein the conductive material is polythiophene.

15. The method of claim 1, wherein the step of forming a substrate comprises passing a moldable thermoplastic material between a pressure roller and a patterned roller so that the moldable thermoplastic material is formed into a substrate having a channel pattern conforming to the roller pattern.

16. The method of claim 1, wherein the step of forming a substrate comprises passing a base material and a moldable thermoplastic material between a pressure roller and a pattern roller having a roller pattern, so that the moldable thermoplastic material is joined to the base and has a channel pattern conforming to the roller pattern.

17. The method of claim 1, wherein the step of forming a substrate comprises forming a substrate having a base surface adapted to receive an image and a patterned surface having the channel pattern.

18. The method of claim 1, further comprising the step of depositing an additional transponder in the overcoat channel pattern.

19. The method of claim 1, wherein the step of forming a substrate further comprises forming a substrate having a base surface with a base channel pattern thereon.

20. The method of claim 19, further comprising the step of depositing conductive material and a second transponder in the base channel pattern.

21. The method of claim 1, further comprising the step of providing an overcoat layer to protect at least one of the conductive material, transponder and substrate against at least one of chemical, radiation, mechanical, electrical or thermal damage.

22. The method of claim 1, further comprising the step of forming the medium into at least one roll with each roll having at least one transponder and antenna.

23. The method of claim 1, further comprising the step of forming the medium into at least one sheet with each sheet having at least one transponder and antenna.

24. The method of claim 1, further comprising the step of recording data in the memory.

25. The method of claim 1, wherein the step of providing the transponder in the channel pattern comprises forming at least a part of the transponder using the conductive material.

26. The method of claim 1, wherein the step of positioning a transponder in the channel pattern comprises providing electrical components in the channel pattern and wherein conductive material deposited in the channel pattern forms electrical connections between the electrical components to form the transponder.

27. The method of claim 1, wherein the step of positioning a transponder in the channel pattern comprises positioning a transponder having an antenna in the channel pattern with the transponder electrically associated with an antenna formed by conductive material deposited in the channel pattern.

28. The method of claim 1, wherein the channel pattern is patterned to form an antenna pattern and a transponder pattern, wherein the transponder is formed at least in part by using the transponder pattern.

29. The method of claim 28, wherein the transponder pattern includes at least one resistor portion formed using conductive material.

30. The method of claim 28 wherein the transponder pattern includes at least one capacitor portion formed using conductive material.

31. A method for forming a medium comprising the steps of:
    forming a substrate web with a patterned surface having a channel pattern;
    providing a transponder having a memory in the channel pattern;
    coating a conductive material into the channel pattern with the conductive material electrically contacting the transponder, wherein said channel pattern includes an antenna pattern and wherein conductive material coated into the antenna pattern forms an antenna operatively associated with the transponder; applying an overcoat to the patterned surface, the overcoat layer having a bottom surface in contact with the patterned surface of the substrate and a top surface having an overcoat channel pattern formed therein; and depositing a conductive material in the overcoat channel pattern, wherein the overcoat comprises at least one contact aperture between the conductive material in the channel pattern on the substrate and the conductive material of the overcoat channel pattern whereby conductive material in the channel pattern on the substrate can electrically engage conductive material from the overcoat channel pattern.

32. The method of claim 31, wherein the substrate web also comprises a base surface and wherein the step of forming the substrate web comprises forming a channel pattern having raised areas at a constant separation from the base surface.

33. The method of claim 31, further comprising the step of providing an overcoat on at least one of the substrate, channel pattern, conductive material and transponder so that a common plane is formed on the medium.

34. The method of claim 31, wherein the conductive material is optically transparent.

35. The method of claim 31, wherein the conductive material has a light transmission of at least 75%.

36. The method of claim 31, wherein the step of forming a substrate web comprises passing a moldable thermoplastic material between a pressure roller and a patterned roller so that the moldable thermoplastic material is formed into a substrate having a channel pattern conforming to the roller pattern.

37. The method of claim 31, wherein the step of forming a substrate web comprises passing a base material and a moldable thermoplastic material between a pressure roller and a pattern roller having a roller pattern, so that the moldable thermoplastic material is joined to the base and has a channel pattern conforming to the roller pattern.

38. The method of claim 31, wherein the step of positioning the transponder in the channel pattern comprises forming at least a part of the transponder using the channel pattern and conductive material.

39. The method of claim 31, wherein the step of positioning a transponder in the channel pattern comprises providing electrical components in the channel pattern and wherein conductive material deposited in the channel pattern forms electrical connections between the electrical components to form the transponder.

40. The method of claim 31, wherein the step of positioning a transponder in the channel pattern comprises positioning a transponder having an antenna in the patterned recess with the transponder antenna electrically associated with an antenna formed by conductive material deposited in the channel pattern.

41. The method of claim 31, wherein the channel pattern is shaped at least in part in an antenna pattern and wherein conductive material is applied to the base in a pattern to form the antenna.

42. The method of claim 31, wherein the web substrate comprises more than one channel pattern, wherein the step of providing a transponder in the web substrate comprises providing a transponder for each channel pattern on the web substrate.

43. The method of claim 42, further comprising the step of separating the web substrate into portions with each portion having at least one transponder and channel pattern.

44. The method of claim 31, further comprising the step of applying an adhesive layer to the medium.

* * * * *

UNITED STATES PATENT AND TRADEMARK OFFICE
CERTIFICATE OF CORRECTION

PATENT NO. : 7,051,429 B2
APPLICATION NO. : 10/411624
DATED : May 30, 2006
INVENTOR(S) : Roger S. Kerr et al.

It is certified that error appears in the above-identified patent and that said Letters Patent is hereby corrected as shown below:

On the title page item (57),
Abstract, line 2        Replace "formed have" with --formed having--

Signed and Sealed this

Nineteenth Day of December, 2006

JON W. DUDAS
*Director of the United States Patent and Trademark Office*